(12) United States Patent
Mori et al.

(10) Patent No.: US 10,338,104 B2
(45) Date of Patent: Jul. 2, 2019

(54) LEAKAGE CURRENT DETECTION DEVICE FOR CONDUCTING WIRES

(71) Applicant: Mitsubishi Electric Corporation, Tokyo (JP)

(72) Inventors: Mitsugi Mori, Tokyo (JP); Kota Kashiwamoto, Tokyo (JP); Keita Hamano, Tokyo (JP); Yoshimasa Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/525,179

(22) PCT Filed: Apr. 10, 2015

(86) PCT No.: PCT/JP2015/061204
§ 371 (c)(1),
(2) Date: May 8, 2017

(87) PCT Pub. No.: WO2016/163022
PCT Pub. Date: Oct. 13, 2016

(65) Prior Publication Data
US 2017/0328933 A1 Nov. 16, 2017

(51) Int. Cl.
*G01R 15/18* (2006.01)
*G01R 31/02* (2006.01)

(52) U.S. Cl.
CPC ......... *G01R 15/183* (2013.01); *G01R 31/025* (2013.01)

(58) Field of Classification Search
CPC .... G01R 15/18; G01R 15/183; G01R 15/185; H02H 1/007
See application file for complete search history.

(56) References Cited

U.S. PATENT DOCUMENTS 4,280,162 A * 7/1981 Tanka ................ H02H 3/332
324/117 R
5,223,789 A 6/1993 Katsuyama et al.
(Continued)

FOREIGN PATENT DOCUMENTS

DE 102005055272 A1 5/2007
JP 2011-174849 A 9/2011
(Continued)

OTHER PUBLICATIONS

International Search Report of PCT/JP2015/061204, dated Jun. 9, 2015 (PSA/210).
(Continued)

*Primary Examiner* — Minh N Tang
(74) *Attorney, Agent, or Firm* — Sughrue Mion, PLLC; Richard C. Turner

(57) ABSTRACT

This current detection device is configured from: an annular magnetic material core that forms a closed magnetic path around a pair of conducting wires in which conduction currents flow; an excitation coil wound on the magnetic material core; an oscillation circuit unit that applies a rectangular wave output voltage to the excitation coil; a power supply unit that supplies power to an operation amplifier that generates the rectangular wave output voltage in the oscillation circuit unit; and a difference current calculation unit, which detects a power supply current flowing from the power supply unit to the operation amplifier, and which calculates a difference current between the conduction currents flowing in the pair of conducting wires. Consequently, excellent noise resistance is achieved, and the configuration of the current detection device is simplified.

2 Claims, 6 Drawing Sheets

(56) References Cited

U.S. PATENT DOCUMENTS

| | | | | |
|---|---|---|---|---|
| 8,390,297 B2* | 3/2013 | Beck | ............... | G01R 27/18 |
| | | | | 324/509 |
| 8,908,338 B2* | 12/2014 | Kinsel | ............... | H02H 3/331 |
| | | | | 361/2 |
| 2012/0299573 A1* | 11/2012 | Vangool | ............... | H01F 38/32 |
| | | | | 323/358 |
| 2014/0320112 A1* | 10/2014 | Nodera | ............... | G01R 15/183 |
| | | | | 324/127 |
| 2015/0228407 A1 | 8/2015 | Takenaka | | |

FOREIGN PATENT DOCUMENTS

| | | |
|---|---|---|
| JP | 2012-002723 A | 1/2012 |
| WO | 2014034117 A1 | 3/2014 |

OTHER PUBLICATIONS

Communication dated Oct. 26, 2018, from the European Patent Office in counterpart European Application No. 15888514.5.

Konstantakos, et al.; "A power measuring technique for built-in testing of Electrochemical Sensors for Environmental Monitoring", International Design and Test Workshop, 2nd IEEE, Dec. 31, 2007, pp. 82-87, XP031206876 (6 pages total).

Gielen, et al., "Fault Detection and Input Stimulus Determination for the Testing of Analog Integrated Circuits Based on Power-Supply Current Monitoring", Computer-Aided Design, IEEE Computer Society Press, Nov. 6, 1994, pp. 495-498, XP058351645 (4 pages total).

Chinese Office Action dated May 14, 2019 in Patent Application No. 201580078712.8.

\* cited by examiner

LEAKAGE CURRENT DETECTION DEVICE FOR CONDUCTING WIRES

CROSS REFERENCE TO RELATED APPLICATIONS

This application is a National Stage of International Application No. PCT/JP2015/061204 filed Apr. 10, 2017, the contents of all of which are incorporated herein by reference in their entirety.

TECHNICAL FIELD

The present invention relates to a current detection device that contactlessly detects a leakage current in conducting wires in which direct currents, alternating currents, or an alternating current and direct current, are superimposed.

BACKGROUND ART

To date, a device that includes an excitation coil wound so as to be electrically insulated and magnetically joined around a magnetic core enclosing conducting wires through which measured currents flow, excitation means that generates a rectangular wave voltage that causes polarity of an excitation current supplied to the excitation coil to invert in accordance with a set threshold value, with the magnetic core in a saturated state or a near-saturated state, and current detection means that detects the measured currents based on a change in a duty ratio of the rectangular wave voltage output from the excitation means, has been disclosed as a current detection device (for example, refer to Patent Document 1). According to this device, there is little effect from ambient environmental conditions, and a wide range of minute current can be detected with a small size and at low cost.

CITATION LIST

Patent Literature

Patent Document 1: JP-A-2012-2723

SUMMARY OF INVENTION

Technical Problem

However, the existing current detection device of Patent Document 1 is such that a separate detection circuit, for example, a pulse width detection circuit, for detecting a change in the duty ratio of the rectangular wave voltage is needed in order to know the magnitude of conduction currents flowing through the conducting wires, and there is a problem in that the size and manufacturing cost of the current detection circuit increase.

Also, when the current detection device is connected to an external control device and used as, for example, a leakage alarm, it is necessary to connect a signal line in order to detect a change in the duty ratio of the rectangular wave voltage, in addition to a power supply line for supplying a drive power supply to the current detection circuit, and when the control device is installed distanced from the current detection device, there is a problem in that the signal line is lengthened, which may cause a malfunction due to a drop in noise resistance.

The invention, having been contrived in order to resolve the heretofore described kinds of problem, has an object of simplifying the configuration of a leakage current detection device, thereby providing a current detection device with excellent noise resistance.

Solution to Problem

In order to resolve the heretofore described problems, a current detection device according to the invention is characterized by including an annular magnetic material core disposed so that a closed magnetic path is formed around a plurality of conducting wires through which conduction currents flow, an excitation coil wound around the magnetic material core, an oscillation circuit unit that generates a rectangular wave voltage to be applied to the excitation coil, a power supply unit that supplies power to a power supply terminal of the oscillation circuit unit, and a difference current calculation unit formed of a current detection circuit, which detects a power supply current flowing into the power supply terminal of the oscillation circuit unit from the power supply unit, and a difference current calculation circuit, which calculates a difference current between the conduction currents of the plurality of conducting wires based on the power supply current.

Advantageous Effects of Invention

According to the current detection device of the invention, detection of a leakage current in a conducting wire, which is a measurement target, is carried out based on the magnitude of a power supply current flowing into a power supply terminal of an oscillation circuit unit, because of which noise resistance is excellent, and as a detection circuit, for example, a pulse width detection circuit, previously needed for detecting a change in the duty ratio of a rectangular wave voltage becomes unnecessary, there is an advantage in that device configuration can be simplified, and manufacturing cost can be restricted.

DESCRIPTION OF EMBODIMENTS

Hereafter, referring to FIG. 1 to FIG. 6, a current detection device according to embodiments of the invention will be described in detail.

First Embodiment

Figure 1:
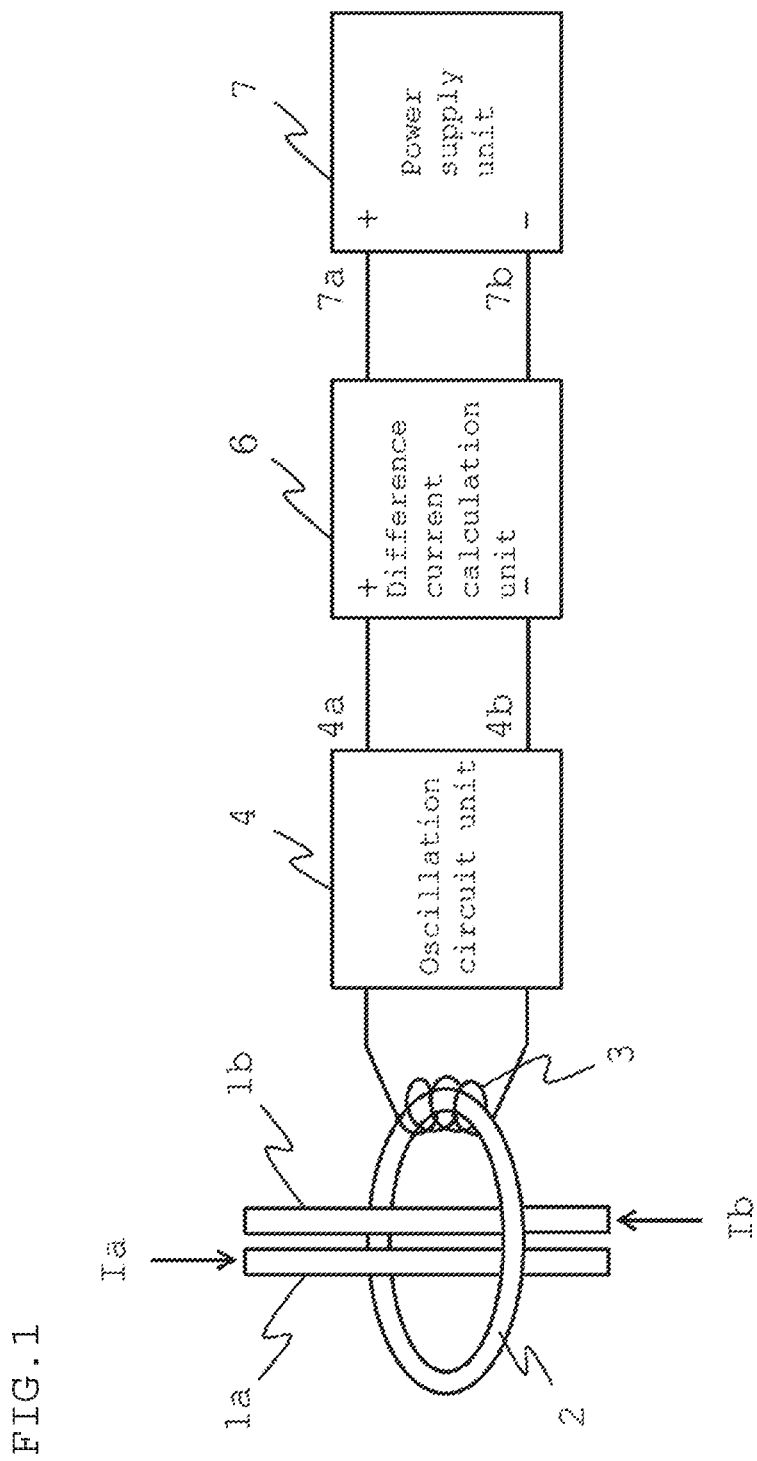
FIG. 1 is a block diagram showing a schematic configuration of a current detection device according to a first embodiment.
Figure 2:
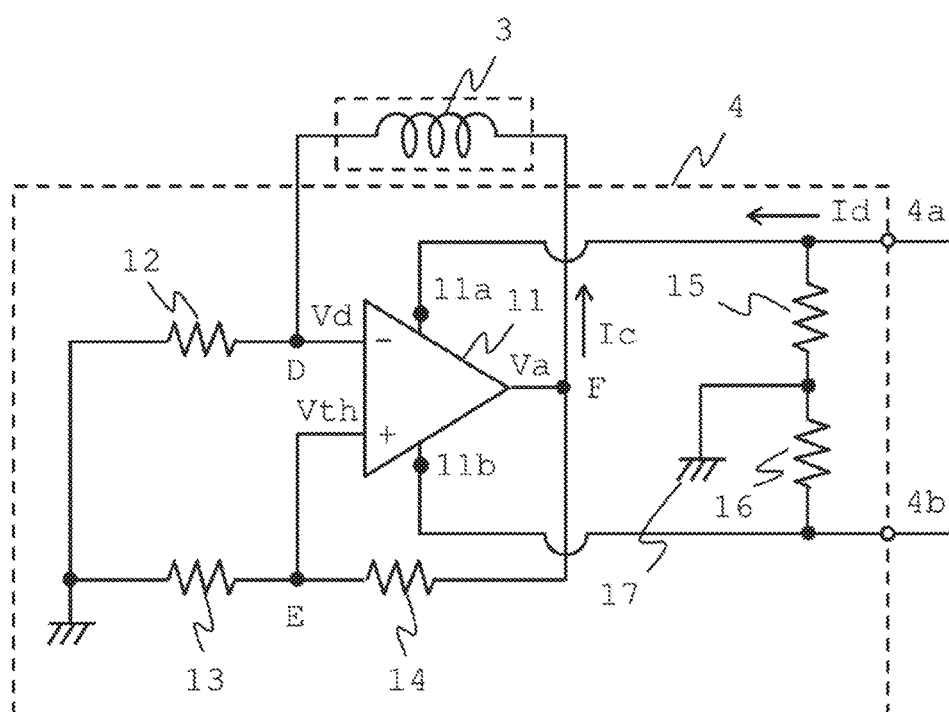
FIG. 2 is a circuit diagram showing details of an oscillation circuit unit shown in FIG. 1.
Figure 3:
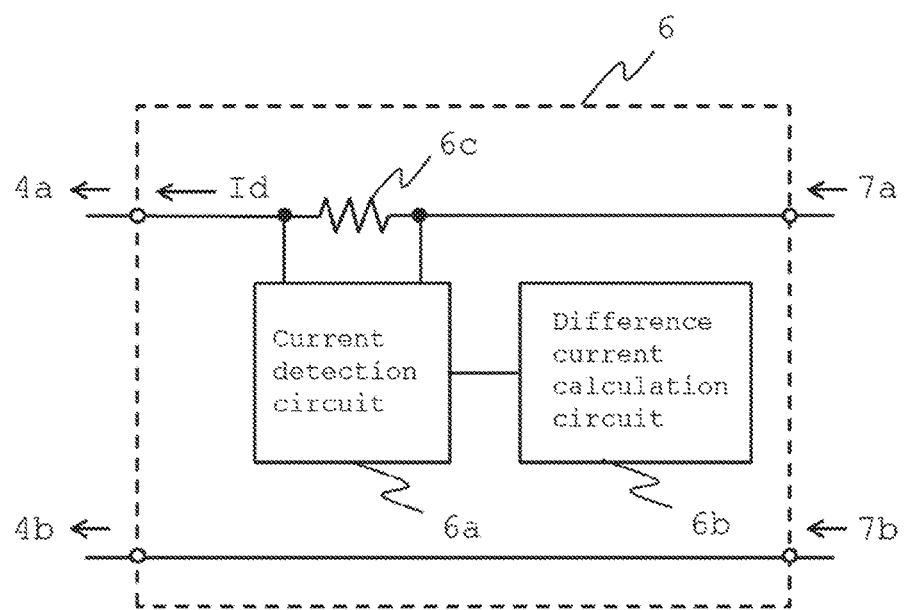
FIG. 3 is a circuit diagram showing details of a difference current calculation unit shown in FIG. 1.
Figure 4A:
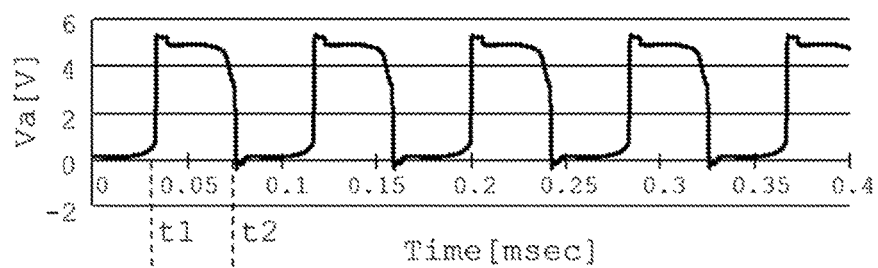
FIG. 4A, 4B, 4C, or 4D is a waveform diagram showing output voltage and excitation current of the oscillation circuit unit shown in FIG. 2.
Figure 4B:
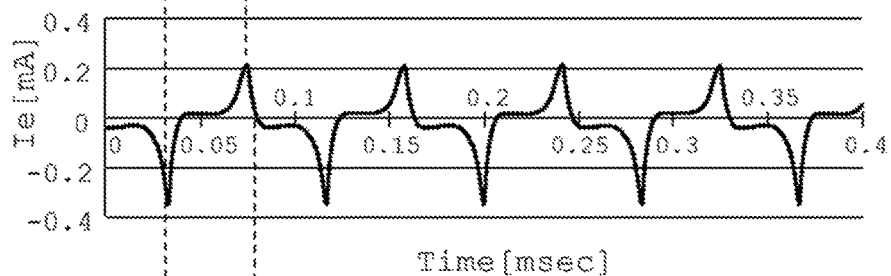
Figure 4C:
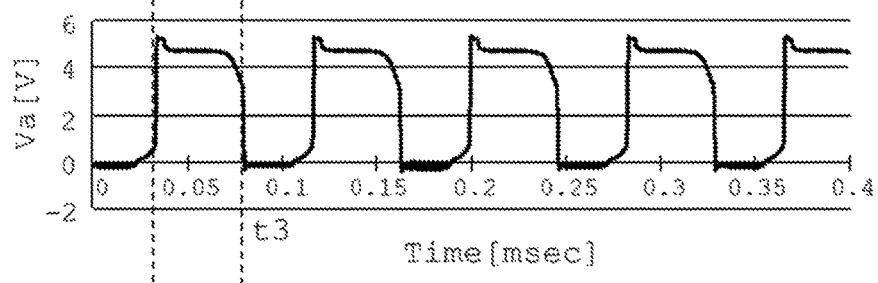
Figure 4D:
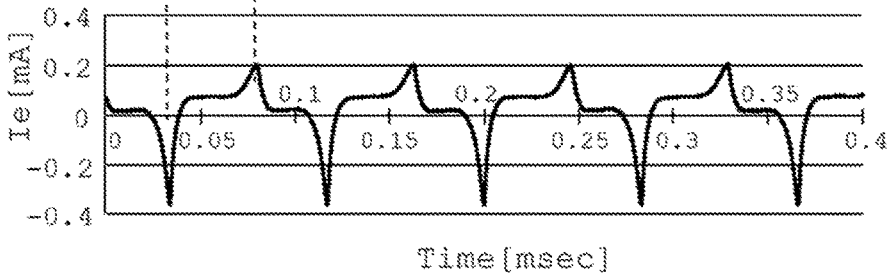
Figure 5:
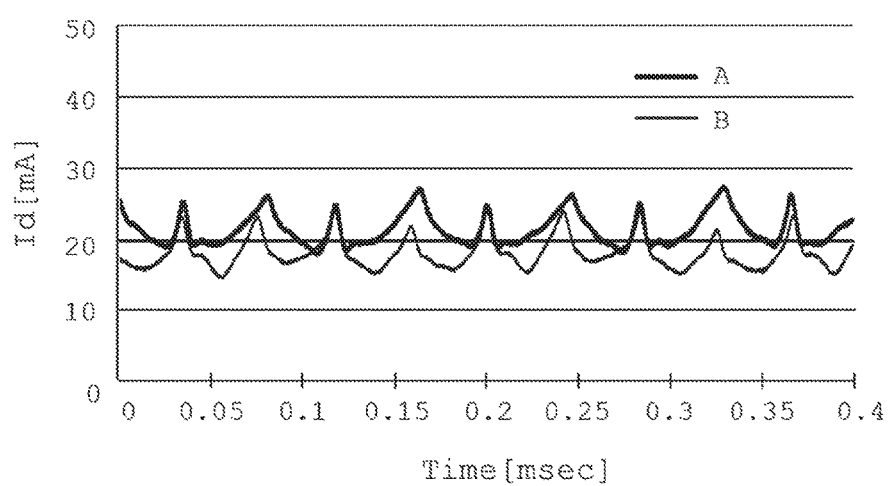
FIG. 5 is a waveform diagram showing power supply current detected by a current detection circuit shown in FIG. 3.

FIG. 1 is a block diagram showing an overall configuration of a current detection device according to a first embodiment, FIG. 2 is a circuit diagram showing details of an oscillation circuit unit in the current detection device, FIG. 3 is a circuit diagram showing details of a difference current calculation unit, FIG. 4A, 4B, 4C or 4D is a waveform diagram showing output voltage and excitation current of the oscillation circuit unit, and FIG. 5 is a waveform diagram showing power supply current detected by the current detection circuit.

Firstly, using FIG. 1 to FIG. 3, a description will be given of a schematic configuration of the current detection device according to the first embodiment. The current detection device is configured of an annular magnetic material core 2 that forms a closed magnetic path around a pair of conducting wires 1a and 1b disposed so as to penetrate a central portion of a ring and through which conduction currents Ia and Ib respectively flow in mutually opposing directions, an excitation coil 3 wound around the magnetic material core 2, an oscillation circuit unit 4 that applies an output voltage Va to the excitation coil 3, a power supply unit 7 that supplies power to a positive power supply terminal 11a and negative power supply terminal 11b of an operation amplifier (hereafter abbreviated to op-amp) 11 configuring a comparator circuit that generates the rectangular wave output voltage Va in the oscillation circuit unit 4, and a difference current calculation unit 6 formed of a current detection circuit 6a, which detects a power supply current Id flowing from the power supply unit 7 to the positive power supply terminal 11a of the op-amp 11, and a difference current calculation circuit 6b, which calculates a difference current ΔI (=Ia−Ib) between the conduction current Ia and conduction current Ib based on the power supply current Id. In the first embodiment, the description is given with a case wherein the conducting wires are, for example, a pair of commercial single phase alternating current conducting wires as an example.

As shown in FIG. 2, the oscillation circuit unit 4 is configured of the op-amp 11 and passive elements (resistances) 12 to 14. A non-inverting input terminal E of the op-amp 11 is connected to an output terminal F via the resistance 14 of, for example, 20 kΩ, and is designed so as to operate as a comparator circuit. Also, a reference voltage Vth supplied to the non-inverting input terminal E is set by the resistance 13, taken to be, for example, 3 kΩ, and the resistance 14. Furthermore, the reference voltage Vth and a voltage Vd, generated in the resistance 12, which is taken to be, for example, 10Ω, and the excitation coil 3 and applied to an inverting input terminal D, are consecutively compared, as a result of which the rectangular wave output voltage Va in accordance with the voltage Vd is output from an output terminal F. Herein, the excitation coil 3 is connected between the inverting input terminal D and output terminal F. Also, resistance 15 and resistance 16 having the same resistance value, for example 10 kΩ, are connected in series between a positive power supply terminal 4a and negative power supply terminal 4b of the oscillation circuit unit 4, to which direct current voltage is supplied via the difference current calculation unit 6 to be described hereafter, and a connection point of the resistance 15 and resistance 16 is grounded, forming an intermediate potential 17.

As shown in FIG. 3, the difference current calculation unit 6 is installed between the power supply unit 7 and oscillation circuit unit 4, supplies power from the power supply unit 7 to the positive power supply terminal 11a and negative power supply terminal 11b of the op-amp 11 via the positive power supply terminal 4a and negative power supply terminal 4b of the oscillation circuit unit 4, and is configured of the current detection circuit 6a, which detects the power supply current Id flowing into the positive power supply terminal 11a, and the difference current calculation circuit 6b, which calculates the difference current ΔI (=Ia−Ib) between the conduction current Ia and conduction current Ib based on the power supply current Id. The current detection circuit 6a detects the power supply current Id flowing into resistance 6c of, for example, 10 Ω installed between a positive output terminal 7a of the power supply unit 7 and the positive power supply terminal 4a of the oscillation circuit unit 4. Herein, a relationship between the power supply current Id and difference current ΔI is obtained in advance by experiment or the like, and the difference current calculation circuit 6b calculates the difference current ΔI from the power supply current Id, thereby obtaining a leakage current.

Herein, an excitation current flowing into the excitation coil 3 is taken to be Ie. Also, a number of turns of the excitation coil 3 is, for example, 1,000 turns, and direct current voltages supplied to the difference current calculation unit 6 from the positive output terminal 7a and a negative output terminal 7b of the power supply unit 7 are, for example, +6V and −6V.

Next, a description will be given of an operation of the current detection device in the first embodiment.

As shown in FIG. 1, the conducting wires 1a and 1b are conducting wires through which the conduction current Ia and conduction current Ib flow, and are disposed so as to penetrate the annular central portion of the magnetic material core 2. A current of several tens to several hundreds of amperes normally flows into each of the conducting wires 1a and 1b, but as the orientations of the currents flowing into the conducting wires 1a and 1b are opposed when the conducting wires are sound, a vectorial sum thereof is zero. However, when an accident such as a leakage or ground fault is occurring, the vectorial sum is not zero, and a minute leakage current of in the region of several milliamps to several hundred milliamps flows. Consequently, a leakage or ground fault can be detected by detecting this minute leakage that occurs due to an accident.

FIG. 4A, 4B, 4C, or 4D is a waveform diagram showing the output voltage Va and excitation current Ie of the oscillation circuit unit 4 shown in FIG. 2, wherein FIG. 4A is the output voltage Va when there is no leakage current, FIG. 4B is the excitation current Ie when there is no leakage current, FIG. 4C is the output voltage Va when there is a leakage current and the minute difference current ΔI (=Ia−Ib) occurs between the conduction current Ia and conduction current Ib flowing into the conducting wire 1a and conducting wire 1b, and FIG. 4D is the excitation current Ie when there is a leakage current and the minute difference current ΔI occurs between the conduction current Ia and conduction current Ib flowing into the conducting wire 1a and conducting wire 1b.

Also, FIG. 5 is a waveform diagram of the power supply current Id, which is the current flowing through the resistance 6c of the difference current calculation unit 6 shown in FIG. 3 detected by the current detection circuit 6a, that is, the current flowing into the positive power supply terminal 11a of the op-amp 11. The power supply current Id can easily be detected using a voltage drop method that measures voltage across the resistance 6c. In FIG. 5, a thick line A indicates a case in which there is a leakage current, while a thin line B indicates a case in which there is no leakage current.

When the output voltage Va of the op-amp 11 reaches a high level at a point t1, as shown in FIG. 4A, this is applied to the excitation coil 3. Because of this, the excitation coil 3 is excited by the output voltage Va and the excitation current Ie in accordance with the value of the resistance 12. The excitation current Ie increases gradually from the point t1 at which the output voltage Va rises in accordance with B-H characteristics of the magnetic material core 2, but when the magnetic material core 2 reaches a saturation region, impedance of the excitation coil 3 drops sharply, and an excitation current Ie increases sharply.

At this time, the voltage Vd on the inverting input terminal D, which is a connection point of the excitation coil 3 and resistance 12, side of the op-amp 11 rises in accordance with the increase of the excitation current Ie of the excitation coil 3, and when the voltage Vd exceeds the reference voltage Vth on the non-inverting input terminal E side, the output voltage Va of the op-amp 11 inverts to a low level, as shown at t2 of FIG. 4A. The excitation current Ie flowing through the excitation coil 3 also shifts to decreasing in accordance with this, as shown in FIG. 4B.

Consequently, the output voltage Va is a rectangular wave voltage that alternates between a high level and low level, and the oscillation circuit unit 4 operates as an astable multivibrator. The excitation current Ie of the excitation coil 3 is of a symmetrical waveform that repeatedly increases and decreases centered practically on a current of "0" when the difference current ΔI between the conduction current Ia and conduction current Ib flowing into the conducting wire 1a and conducting wire 1b is zero.

As opposed to this, when a difference occurs between the conduction current Ia and conduction current Ib flowing into the conducting wire 1a and conducting wire 1b, the B-H characteristics of the magnetic material core 2 shift in accordance with the difference current ΔI, because of which a change occurs in the timing at which inductance disappears owing to magnetic saturation, as shown at a point t3 of FIG. 4C, and a period for which the output voltage Va is at a high level lengthens in a cycle in which the output voltage Va alternates between a high level and low level. At this time, the excitation current Ie is in a state such as to have a positive bias with respect to a current of "0", as shown in FIG. 4D.

The power supply current Id of the op-amp 11 detected in the current detection circuit 6a is also such that the power supply current Id of the op-amp 11 increases further when the difference current ΔI exists compared with when the difference current ΔI between the conduction current Ia and conduction current Ib flowing into the conducting wire 1a and conducting wire 1b is zero, as shown in FIG. 5. Consequently, a power supply current Io that flows into the positive power supply terminal 11a of the op-amp 11 when the difference current ΔI between the conduction current Ia and conduction current Ib flowing into the conducting wire 1a and conducting wire 1b is zero is measured in advance, and by the power supply current Io when the difference current ΔI is zero being subtracted from the power supply current Id when the difference current ΔI occurs, a measurement proportional to the excitation current Ie can be obtained without directly measuring the excitation current Ie.

Specifically, it is sufficient that a movement average process is performed for a certain period with respect to the power supply current Id of the op-amp 11 obtained from the voltage across the resistance 6, and after the power supply current Io measured in advance is subtracted, a process of comparing with a predetermined threshold value is carried out. By so doing, conducting wire leakage can be contactlessly detected.

In the first embodiment, a description has been given with a case wherein a comparator circuit is configured using an op-amp as an example but, the case wherein an op-amp is used not being limiting, the comparator circuit may also be configured of individual electronic circuit parts.

Also, the frequency of the rectangular wave voltage is not particularly limited, provided that the frequency is higher than the frequency of the measured currents flowing through the conducting wires.

Because of this, when a leakage current occurs due to leakage or the like in a conducting wire through which a conduction current flows, the leakage current can be detected, and the current detection device of this embodiment can be applied to an earth leakage breaker or leakage alarm.

In this way, according to the current detection device of the first embodiment, detection of a leakage current in a conducting wire, which is a measurement target, is carried out based on the magnitude of a power supply current flowing into a power supply terminal of an oscillation circuit unit, whereby device configuration can be simplified, a detection circuit, for example, a pulse width detection circuit, previously needed for detecting a change in the duty ratio of the rectangular wave voltage becomes unnecessary, and there is an advantage in that manufacturing cost can be restricted.

Second Embodiment

Figure 6:
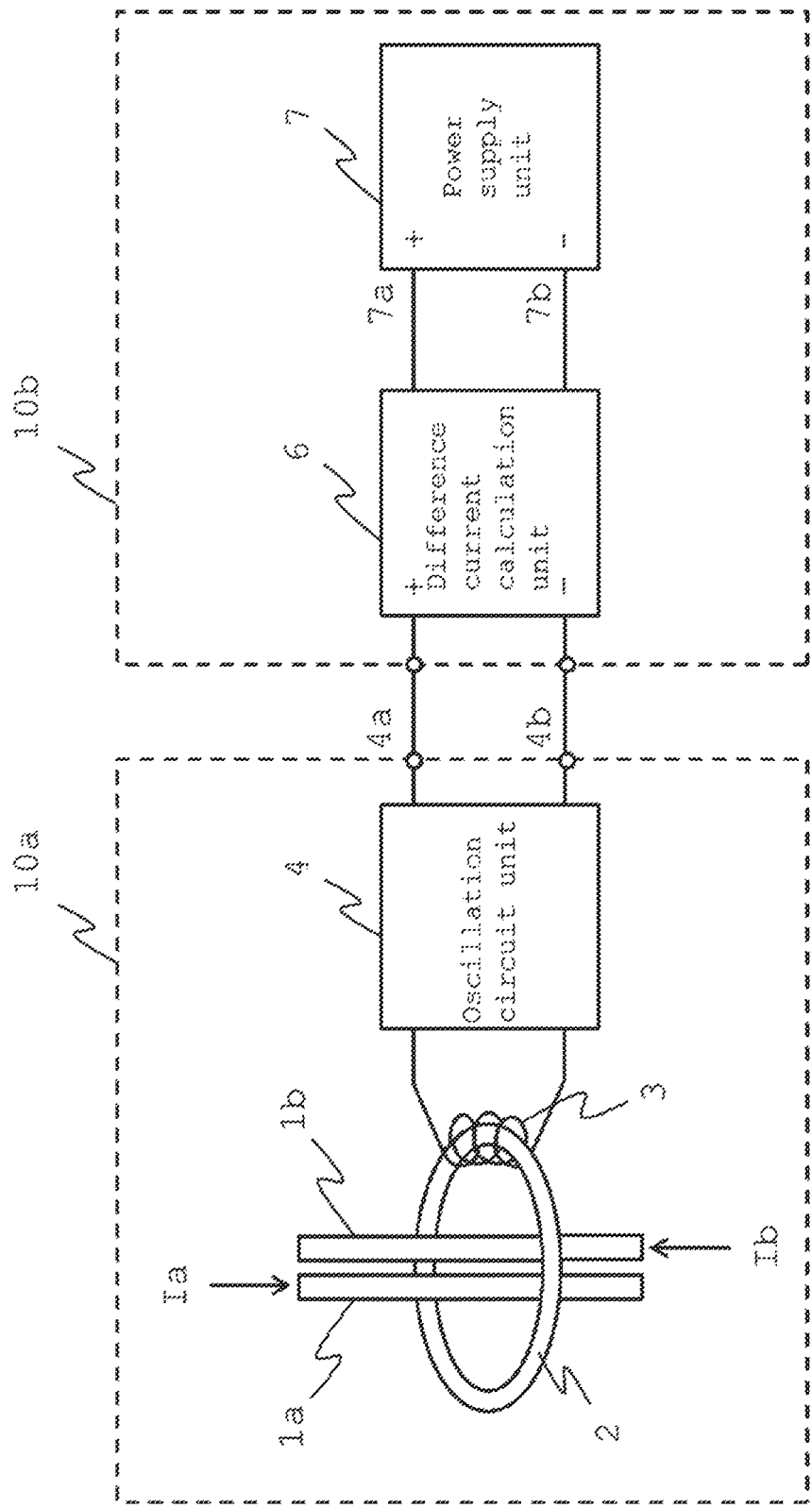
FIG. 6 is a block diagram showing a schematic configuration of a current detection device according to a second embodiment.

FIG. 6 is a block diagram showing an overall configuration of a current detection device according to a second embodiment. A difference from the current detection device according to the first embodiment is that the device can be divided into a current sensor unit 10a configured of the magnetic material core 2, excitation coil 3, and oscillation circuit unit 4 and a current detection unit 10b configured of the difference current calculation unit 6 and power supply unit 7, and the current sensor unit 10a and current detection unit 10b can be installed in places distanced from each other. As a configuration and operation of the current detection device of the second embodiment are the same as in the case of the current detection device of the first embodiment, a description will be omitted.

The current detection device of the invention utilizes a change in the power supply current Id flowing into the positive power supply terminal 11a of the comparator circuit of the oscillation circuit unit 4 in current detection, because of which, even when the current sensor unit 10a and current detection unit 10b are distanced from each other, and even when a power supply wire of the oscillation circuit unit 4 linking the current sensor unit 10a and current detection unit 10b is lengthened, there is less likelihood of being affected by noise than when extending a signal line that transmits an excitation current detection signal, as is the case with an existing current detection device, and as no signal line is needed, the current detection device can be simplified. Because of this, conducting wire leakage current can be monitored from a distanced place, and the current detection device can be connected to an external control device and used as, for example, a leakage alarm.

In this way, according to the current detection device according to the second embodiment, the same advantages as in the first embodiment are obtained, and even though the current detection device is divided into a current sensor unit and current detection unit and the two are installed in places distanced from each other, a change in power supply current flowing into a power supply terminal of an oscillation circuit unit is utilized in leakage current detection, and a signal line that transmits an excitation current detection signal, as is the case to date, is not used, because of which there is less likelihood of being affected by noise. Also, as no signal line is needed, there is an advantage in that a configuration of the current detection device can be simplified, and manufacturing cost can be reduced.

In this embodiment, a description has been given of a current detection device when used for a single-phase alternating current and in which the conducting wires are a pair, but even when used for a three-phase alternating current and there are three conducting wires, the vectorial sum of the conducting wires is zero provided that there is no leakage current, because of which the current detection device can be applied in the same way. The same applies in the case of a current detection device for direct current.

Also, the embodiments can be freely combined, and each embodiment can be modified or abbreviated as appropriate, without departing from the scope of the invention.

Also, identical reference signs in the drawings indicate identical or corresponding portions.

REFERENCE SIGNS LIST

1*a*, 1*b* Conducting wire, 2 Magnetic material core, 3 Excitation coil, 4 Oscillation circuit unit, 4*a* Positive power supply terminal, 4*b* Negative power supply terminal, 6 Difference current calculation unit, 6*a* Current detection circuit, 6*b* Difference current calculation circuit, 6*c* Resistance, 7 Power supply unit, 10*a* Current sensor unit, 10*b* Current detection unit, 11 Op-amp, 11*a* Positive power supply terminal, 11*b* Negative power supply terminal, 12 to 17 Resistance.

The invention claimed is:

1. A current detection device, comprising:
   an annular magnetic material core disposed so that a closed magnetic path is formed around a plurality of conducting wires through which conduction currents flow;
   an excitation coil wound around the magnetic material core;
   an oscillation circuit unit that generates a rectangular wave voltage to be applied to the excitation coil;
   a power supply unit that supplies power to a power supply terminal of the oscillation circuit unit; and
   a difference current calculation unit formed of a current detection circuit, which detects a first power supply current flowing into the power supply terminal of the oscillation circuit unit from the power supply unit, and a difference current calculation circuit, which calculates a difference current between the conduction currents of the plurality of conducting wires based on the first power supply current,
   wherein a second power supply current is measured when the difference current is zero, and
   wherein a leakage in the plurality of conducting wires is detected based on a difference between the first power supply current and the second power supply current.

2. The current detection device according to claim 1, wherein the difference current calculation unit and power supply unit are separated from the oscillation circuit unit, and installed in a distanced place.

* * * * *